US011360178B2

(12) United States Patent
Botnar et al.

(10) Patent No.: US 11,360,178 B2
(45) Date of Patent: Jun. 14, 2022

(54) METHOD AND APPARATUS FOR RECONSTRUCTING MAGNETIC RESONANCE IMAGE DATA (71) Applicant: Siemens Healthcare Limited, Camberley (GB)

(72) Inventors: Rene Botnar, London (GB); Teresa Correia, London (GB); Radhouene Neji, London (GB); Claudia Prieto, London (GB)

(73) Assignee: Siemens Healthcare GmbH, Erlangen (DE)

( * ) Notice: Subject to any disclaimer, the term of this patent is extended or adjusted under 35 U.S.C. 154(b) by 395 days.

(21) Appl. No.: 16/382,698

(22) Filed: Apr. 12, 2019

(65) Prior Publication Data

US 2019/0317172 A1 Oct. 17, 2019

(30) Foreign Application Priority Data

Apr. 12, 2018 (GB) ..................... 1806025

(51) Int. Cl.
*G01R 33/565* (2006.01)
*G06T 11/00* (2006.01)
*G01R 33/56* (2006.01)

(52) U.S. Cl.
CPC ... *G01R 33/56509* (2013.01); *G01R 33/5608* (2013.01); *G06T 11/005* (2013.01); *G06T 2210/41* (2013.01)

(58) Field of Classification Search
CPC .......... G01R 33/56509; G01R 33/4818–4822; G01R 33/5608
See application file for complete search history.

(56) References Cited

U.S. PATENT DOCUMENTS

2016/0104279 A1\* 4/2016 Li ........................... G06K 9/52
382/131

FOREIGN PATENT DOCUMENTS

CN 102934995 B 11/2014
EP 3179264 A2 6/2017

OTHER PUBLICATIONS

Feng, Li, et al. "Compressed sensing for body MRI." Journal of Magnetic Resonance Imaging 45.4 (2017): 966-987. (Year: 2017).\*

(Continued)

*Primary Examiner* — Vincent Rudolph
*Assistant Examiner* — Raphael Schwartz
(74) *Attorney, Agent, or Firm* — Banner & Witcoff Ltd.

(57) ABSTRACT

In a method for reconstructing magnetic resonance (MR) image data from k-space data, k-space data of an image region of a subject are provided to a computer that is also provided with multiple navigator signals for the image region of the subject. The computer sorts the k-space data into multiple bins, the multiple bins representing different motion states of the subject. For each of the multiple bins, the computer executes a compressed sensing procedure to reconstruct the MR image data from the k-space data in the respective bin. Execution of the compressed sensing procedure includes solving an optimization problem comprising a data consistency component and a transform sparsity component. Motion information is incorporated by the computer into at least one of the data consistency component and the transform sparsity component of the optimization problem.

16 Claims, 1 Drawing Sheet (56) References Cited

OTHER PUBLICATIONS

Feng, L., et al. "Golden-angle sparse liver imaging: radial or Cartesian sampling." Proceedings of the 25th Annual Meeting of ISMRM, Honolulu, HI. 2017. (Year: 2017).*

Cruz, Gastao, et al. "Highly efficient nonrigid motion-corrected 3D whole-heart coronary vessel wall imaging." Magnetic resonance in medicine 77.5 (2017): 1894-1908. (Year: 2017).*

Piccini, Davide, et al. "Four-dimensional respiratory motion-resolved whole heart coronary MR angiography." Magnetic resonance in medicine 77.4 (2017): 1473-1484. (Year: 2017).*

Royuela-del-Val, Javier, et al. "Nonrigid groupwise registration for motion estimation and compensation in compressed sensing reconstruction of breath-hold cardiac cine MRI." Magnetic resonance in medicine 75.4 (2016): 1525-1536. (Year: 2016).*

Correia, Teresa, et al. "Technical note: Accelerated nonrigid motion-compensated isotropic 3D coronary MR angiography." Medical physics 45.1 (2017): 214-222. (Year: 2017).*

Feng, Li et al, XD-GRASP: Golden-Angle Radial MRI with Reconstruction of Extra Motion-State Dimensions Using Compressed Sensing, Magn Reson Med. Feb. 2016; 75(2): 775-788. doi:10.1002/mrm.25665, pp. 1-25; 2016.

Xiao Chen Motion-Guided Temporally-Constrained Compressed Sensing for Dynamic MRI Proc. Intl. Soc. Mag. Reson. Med. 20 (2012).

M. Salman Asif et al: "Motion-adaptive spatio-temporal regularization for accelerated dynamic MRI", Magnetic Resonance in Medicine, Bd. 70, Nr. 3, pp. 800-812, XP055159307; ISSN: 0740-3194, DOI: 10.1002/mrm.24524; 2012.

P.G. Batchelor et al—Matrix description of general motion correction applied to multishot images; Batchelor et al., Magnetic Resonance in Medicine 54 (2005), pp. 1273-1280.

Menchon-Lara, R.M et al.: "Motion Compensated 5D Free-Breathing Whole-Heart Isotropic CINE MRI. An approach based on elastic groupwise registration to promote sparsity." in ESMRMB 2017; #576; pp. 542-543.

Correia Teresa et al. "Assessment of respiratory motion-resolved and nonrigid motion-corrected 3D Cartesian coronary MRA" Proc. Intl. Soc. Mag. Reson. Med. 26 (2018), 0473.

Correia Teresa et al. "Optimized Respiratory-resolved Motion-compensated 3D Cartesian Coronary MR Angiography" in Magnetic Resonance in Medicine 2018; pp. 2618-2629.

* cited by examiner

METHOD AND APPARATUS FOR RECONSTRUCTING MAGNETIC RESONANCE IMAGE DATA

BACKGROUND OF THE INVENTION

Field of the Invention

The present invention concerns a method of reconstructing magnetic resonance (MR) image data, and a non-transitory, computer readable data storage medium, and a MR imaging apparatus that implement such a method.

In particular the invention is concerned with a method for reconstructing magnetic resonance image data from k-space data, and in particular undersampled k-space data.

Description of the Prior Art

In magnetic resonance (MR) imaging, imaging data is commonly acquired as samples of the Fourier transform of the subject to be reconstructed. These samples are referred to as "k-space" data. Images are generated from the k-space data using an image reconstruction process which can involve recovering an estimate of the original subject from the k-space data.

Only a limited amount of k-space data may be acquired at any given time. There may also be delays between the k-space data acquisitions due to the time required for the signal excitation and encoding processes inherent to MR imaging. This typically means that the k-space data for an imaging region of the subject is acquired over several respiratory cycles of the subject. This may mean that respiratory motion artefacts are introduced into the k-space data, and as a result the quality of the reconstructed images may be reduced.

Respiratory motion is a particular problem in the free-breathing imaging of a volume region of a subject. One particular application of such is three-dimensional whole-heart coronary MR angiography (CMRA).

One existing approach for minimizing respiratory motion artefacts is to use navigator pulses in the MR imaging sequence. The navigator pulses are typically applied so as to excite 1-dimensional beams or 2-dimensional planes of tissue. The navigator pulses result in a navigator signal (an echo signal) being returned, and which may be reconstructed in the readout direction. In particular, one existing approach uses navigator pulses to track the movement of the diaphragm of the subject, and acquires MR data using a gated approach. This means that MR data is only acquired when the detected motion of the diaphragm of the subject is within an acceptable range. Alternatively, the MR data may also be acquired outside the acceptable range, but such MR data may be rejected and reacquired.

This diaphragmatic respiratory motion approach may help to minimize ghosting and blurring artefacts caused by respiratory motion. However, this approach may only act to minimize the effect of motion in the superior-inferior (SI) direction, and may not account for motion components in other directions. Moreover, this existing approach has a low scan efficiency because MR data is only acquired when the subject motion is within an acceptable range or is acquired but rejected when outside the acceptable range and subsequently re-acquired. This leads to prolonged scan times.

Another approach known as XD-GRASP (eXtra-Dimensional Golden-angle Radial Sparse Parallel MR imaging) has been proposed to achieve approximately 100% scan efficiency, meaning that no data is rejected, while still compensating for respiratory induced motion of the subject.

XD-GRASP uses a non-Cartesian k-space sampling scheme, and in particular a radial k-space sampling scheme with a golden-angle (111.25°) separation between radial samples.

Radial k-space sampling means that the k-space samples may be designated as lying in the $k_x$-$k_y$ plane in k-space, and that adjacent k-space samples may be angularly separated from one another such that each k-space sample represents a spoke of a wheel. Golden-angle separation means that there is a 111.25° angular increment between consecutive spokes. Radial k-space sampling contrasts with Cartesian k-space sampling where the k-space samples are rectilinear. That is, the k-space samples run parallel to one another.

Due to the nature of the radial sampling scheme, the center of k-space is sampled repeatedly. This means that radial sampling has reduced sensitivity to k-space gaps due to motion-related phase shifts. As a result, the XD-GRASP sequence helps minimize the effect of motion on the reconstruction.

XD-GRASP may be used to obtain k-space data for a 2D image region or a 3D image volume. In order to generate k-space data for a 3D image volume, XD-GRASP uses a 3D stack-of-stars sampling scheme, in which golden angle radial sampling is used in the $k_x$-$k_y$ plane and Cartesian sampling is used in the $k_z$ dimension. Another XD-GRASP approach uses a 3D spiral phyllotaxis trajectory.

XD-GRASP sorts the acquired k-space data into multiple sets of undersampled datasets with distinct motion states using motion signals extracted directly from the k-space data.

In particular, the center of k-space ($k_x$=$k_y$=0 for 2D and $k_x$=$k_y$=$k_z$=0 for 3D) in each projection angle can be used to obtain the temporal variation caused by subject motion. In addition or alternatively, for 3D, a 1D projection may be used for self-navigation when a spiral phyllotaxis trajectory is used. The center of k-space corresponds to a constant term in the Fourier representation of the image, whose magnitude is the same as the average image brightness. Thus, by comparing the center of k-space values for the different projection angles, the change in the center of k-space value across the different projection angles can be determined, and used to estimate the subject respiratory motion.

As a result of the sorting process used by XD-GRASP, the acquired data is sorted into multiple respiratory phases, which are known as and will subsequently be referred to as respiratory bins. The respiratory bins of k-space data are then reconstructed to generate respiratory resolved images. This reconstruction is performed using a compressed sensing algorithm which exploits total variation (TV) sparsity along the respiratory dimension.

In particular, XD-GRASP reconstructs each under-sampled respiratory bin using a compressed sensing procedure. In particular, XD-GRASP solves an optimization problem of the form:

$$\hat{x} = \arg\min_x \left\{ \frac{1}{2} \|Ex - k\|_2^2 + \alpha \Psi_t(x) \right\} \tag{1}$$

Here, x is the respiratory-resolved image series, k is the binned k-space data. The encoding operator E=AFS incorporates the sampling matrix A for each bin i, Fourier transform F and coil sensitivities S.

Here, $\|\ \|_2^2$ denotes the $l_2$-norm defined as $\|u\|_2^2 = \sqrt{(\Sigma_i |u_i|^2)}$, for a given vector u.

Here, $\Psi_t$ is a 1D temporal total variation (TV) function applied in the respiratory-resolved direction. Here, $\alpha$ is a regularization parameter.

The component $\frac{1}{2}\|Ex-k\|_2^2$ of the optimization problem is known as a data consistency component of the compressed sensing procedure.

The component $\Psi_t(x)$ of the optimization problem is known as a transform sparsity component of the compressed sensing procedure.

The parameter $\alpha$ is a regularization parameter that determines the trade-off between the data consistency and the sparsity.

While XD-GRASP has been successful in providing respiratory resolved 3D radial CMRA images with 100% scan efficiency, XD-GRASP has been shown to suffer from reduced image quality when using a Cartesian rather than a radial sampling scheme. A Cartesian sampling scheme may be used in many applications including, for example, Cartesian liver imaging. The reduced image quality is particularly pronounced for respiratory phases with large respiratory displacements.

SUMMARY OF THE INVENTION

An object of the present invention is to provide an improved approach for reconstructing MR image data from k-space data, or at least provide an alternative to the existing reconstruction approaches. It is a particular objective to provide an improved reconstruction approach that is robust to motion even when a Cartesian sampling scheme is used to acquire the k-space data.

According to a first aspect of the invention, there is provided a method of reconstructing MR image data from k-space data. The method includes providing a computer with k-space data of an image region of a subject and providing the computer with a number of navigator signals for the image region of the subject. The method includes sorting the k-space data into a number of bins, the number of bins representing different motion states of the subject. The method further includes, for each of the multiple bins, executing a compressed sensing procedure in the computer to reconstruct the MR image data from the k-space data in the respective bin. The compressed sensing procedure includes solving an optimization problem involving a data consistency component and a transform sparsity component. Motion information for the subject obtained from the number of navigator signals is incorporated by the computer into at least one of the data consistency component and the transform sparsity component of the optimization problem.

Significantly, the present invention acquires navigator signals for the image region of the subject, and uses motion information of the subject obtained from the plurality of navigator signals to reconstruct the bins of k-space data as part of a compressed sensing procedure. In this way, the motion information may be used to provide robustness against subject motion in the reconstruction even if a Cartesian sampling scheme is used. Further, the present invention is not required to acquire the k-space data in a motion gated way because the motion information is used in the reconstruction. As such, k-space data may be acquired with close to or even 100% scan efficiency.

Generally, the present invention uses motion information to increase sparsity. The motion information may relate to subject motion such as respiratory motion or cardiac motion. In this way, the present invention is able to minimize respiratory motion artefacts and artefacts due to cardiac motion. As such, respiratory and/or cardiac resolved MR image data may be reconstructed.

The acquired k-space data may be sub-sampled (undersampled) k-space data. By sub-sampled, we mean that the k-space data is acquired using fewer echoes than a conventional MR scan. In other words, only data for part of the k-space is collected. The k-space data may be acquired using an incoherent sampling scheme. This may be so as to create a noise-like appearance for the aliasing artefacts that are generated as a result of the sub-sampling. The noise-like artefacts may be removed in a subsequent step of the optimization procedure.

As explained above, the MR image data are reconstructed from the k-space data using a compressed sensing procedure. The compressed sensing procedure comprises solving an optimization problem that comprises a data consistency component and a transform sparsity component.

The data consistency component acts to ensure that the reconstructed MR image data is consistent with the original acquired k-space data. That is, the data consistency component may be a constraint on the optimization problem that takes into account the difference between the MR image data transformed into k-space and the original acquired k-space data. The optimization problem may seek to minimize the difference between the MR image data transformed into k-space and the original acquired k-space data. This minimization may be subject to other constraints, e.g. the transform sparsity component.

The transform sparsity component of the compressed sensing procedure acts to increase the sparsity of the MR image data in a sparse representation space known as W-space. The increase in sparsity corresponds to a diminishing of the aliasing artefacts in the image space. The optimization problem may seek to maximize the sparsity. This maximization may be subject to other constraints, e.g. the data consistency component.

Thus, the compressed sensing procedure refers to a procedure in which MR image data is reconstructed that is both consistent with the original acquired k-space data and also forms a sparse representation when transformed into W-space.

The k-space data may be acquired over a number of cardiac cycles for the subject. Each of the number of navigator signals may be acquired during a respective one of the number of cardiac cycles.

The number of bins may represent different motion states of the subject. The different motion states may be different respiratory phases of the subject.

Sorting the k-space data into the number of bins may sort the k-space data into the number of bins using the motion information for the subject obtained from the plurality of navigator signals.

The method may further include correcting for motion within the number of bins using the motion information for the subject obtained from the number of navigator signals so as to generate motion corrected binned k-space data. The data consistency component may use the motion corrected binned k-space data. In other words, intra-bin motion correction may be performed. Significantly, correcting for motion within the plurality of bins helps to improve the image quality of each bin, and thus minimize the effect of motion on the reconstruction.

Correcting for motion within the plurality of bins may involve correcting for translational motion within the number of bins. The translational motion may be 2D translational motion. The motion information may be beat-to-beat translation information. The beat-to-beat translation information may be 2D beat-to-beat translation information.

The data consistency component of the optimization problem may be a determination of the difference between the reconstructed MR image data, x, and the motion corrected binned k-space data, b.

The data consistency component may be a determination of the difference between the reconstructed MR image data, x, transformed into k-space and the motion corrected binned k-space data, b.

The determination of the difference may be determining the $l_2$-norm of the result of a subtraction of the motion corrected binned k-space data from the reconstructed MR image data transformed into k-space.

The data consistency component may be the function $½\|Ex-b\|_2^2$, wherein x is the reconstructed MR image data, wherein b is the motion corrected binned k-space data, wherein E is an encoding operator for transforming the reconstructed MR image data into k-space, and wherein $\| \|_2^2$ denotes the $l_2$-norm defined as $\|u\|_2^2=\sqrt{(\Sigma_i|u_i|^2)}$, for a given vector u.

The reconstructed MR image data x, may be of the form: $x=[x_1, x_2, \ldots, x_N]^T$, wherein N is the number of bins. It will be appreciated that optimal values for x are desired to be determined by solving the optimization problem.

The motion corrected binned k-space data b, may be of the form: $b=[b_1, b_2, \ldots, b_N]^T$, wherein N is the number of bins.

Significantly, unlike the existing XD-GRASP approach which incorporates the function $½\|Ex-k\|_2^2$ in the reconstruction problem, where k is the binned k-space data (i.e. not motion corrected), the present invention may incorporate motion corrected binned k-space data, b, in the reconstruction problem.

The encoding operator may be defined as E=AFS. The encoding operator may thus incorporate the sampling matrix A for each bin b, Fourier transform F and coil sensitivities S.

The transform sparsity component may comprise a sparsifying transform $\Psi_t$ for transforming the reconstructed MR image data, x, into W-space. That is, the sparsifying transform is an operator that maps the MR image data into a sparse W-space.

The sparsifying transform may be a temporal (e.g. one-dimensional) total variation function. The total variation function may be applied in the forward direction, e.g. the respiratory resolved direction.

The sparsifying transform may be a wavelet transform. Other forms of sparsifying transform are within the scope of the present invention.

The reconstructed MR image data, x, may first be transformed to a motion-corrected domain using the motion information for the subject obtained from the plurality of navigator signals. The motion-corrected reconstructed MR image data may then undergo the sparsifying transform. In other words, the transform sparsity component transforms the reconstructed MR image data to a motion-corrected domain using the motion information for the subject obtained from the plurality of navigator signals so as to generate motion-corrected reconstructed MR image data, and applies a sparsifying transform to the motion-corrected reconstructed MR image data.

Significantly, incorporating the motion information for the subject into the sparsifying transform helps increase the sparsity within the motion domain of the subject (e.g. the respiratory domain). This is because the MR image data is aligned to one motion position (e.g. respiratory position) during the reconstruction.

The sparsifying transform may be the function $\Psi_t(\mathcal{R}x)$ where $\mathcal{R}x$ is the motion-corrected domain.

$\mathcal{R}x$ may be a motion-corrected domain and may be determined such that $\mathcal{R}x=T_b x_b$, wherein $T_b$ is a translation transform that maps a bin image $x_b$ to a reference image $x_r$ determined using the motion information. The reference image may be an end-expiration image.

The sparsifying transform component may comprise performing a finite differences operation on the motion-corrected reconstructed MR image data, $\mathcal{R}x$.

The transform sparsity component may comprise determining the $l_1$-norm of the result of the finite differences operation performed on the motion-corrected reconstructed MR image data.

In one example, the sparsifying transform may be defined as:

$$\Psi_t(\mathcal{R}x) = \|\nabla_t(\mathcal{R}x)\|_1 = \left\| \begin{bmatrix} I & -I & 0 & \cdots & 0 \\ 0 & I & -I & \cdots & 0 \\ \vdots & & \ddots & & \vdots \\ 0 & \cdots & 0 & I & -I \end{bmatrix} \begin{bmatrix} \mathcal{T}_1 x_1 \\ \mathcal{T}_2 x_2 \\ \vdots \\ \mathcal{T}_N x_N \end{bmatrix} \right\|_1$$

In this example, $\nabla_t$ is a finite differences operator along the temporal motion (e.g. respiratory) dimension, I is the identity matrix and $\mathcal{T}_b$ is the translation transform that maps the bin image $x_b$ to the reference image $x_1$ (end-expiration).

In this example, $\mathcal{T}_1=I$. But this is not required in all examples.

$\|u\|_1$ is the $l_1$-norm and is defined as $\|u\|_1=\Sigma_{i=1}^n |u(i)|$, where i is the ith element of u and n is the total number of elements.

The transform sparsity component may be a sparsifying transform in the forward direction and a sparsifying transform in the backward direction. The sparsifying transform in the forward direction may be of the form $\Psi_t(\mathcal{R}x)$. The sparsifying transform in the backward direction may be of the form $\Psi_{-t}(\mathcal{R}x)$.

In one example, the optimization problem may thus be a transform sparsity component of the form: $\alpha\Psi_t(\mathcal{R}x)+\gamma\Psi_{-t}(\mathcal{R}x)$, wherein $\gamma$ is a regularization parameter.

The use of a sparsifying transform in the forward and backward directions may help exploit temporal redundancies in both forward and backward directions. This may help to provide a sparser representation of the motion-corrected domain. In particular, finite differences sparsity along the motion (e.g. respiratory) dimension may be calculated between every motion (e.g. respiratory) phase, $x_i$, and its two adjacent motion phases, $x_{i-1}$, and $x_{i+1}$, in order to exploit the temporal redundancies in both forward and backward directions. This approach may also involve applying a translation transformation to map $x_{i-1}$ to $x_i$ and another transformation to map $x_{i+1}$ to $x_i$.

The optimization problem may further comprise a spatial total variation function of the form $\beta\Psi_s(x)$, wherein $\beta$ is a regularization parameter, and wherein $\Psi_s(x)$ is a spatial total variation function. The spatial total variation function may be a three-dimensional spatial total variation function.

Both the data consistency component and the transform sparsity component of the optimization problem may incorporate the motion information for the subject obtained from the plurality of navigator signals.

The optimization problem may be of the form $$\hat{x} = \arg\min_x f(x),$$

wherein $f(x)$ is a function defined as {data consistency component+transform sparsity component}. The optimization problem may thus comprise determining a value for the reconstructed MR image data set, x, at which a function $f(x)$ attains its minimum.

The optimization problem may be of the form:

$$\hat{x} = \arg\min_x \{\text{data consistency component} + \alpha(\text{transform sparsity component})\}.$$

Here, $\alpha$ is a regularization parameter that defines the trade-off between the data consistency and the sparsity.

The optimization problem may be of the form:

$$\hat{x} = \arg\min_x \left\{ \frac{1}{2}\|Ex - b\|_2^2 + \alpha\Psi_t(x) \right\} \quad (2)$$

Here, $\Psi_t(x)$ is a sparsifying function.

In equation (2) the optimization problem incorporates the motion information in the data consistency component, but does not incorporate motion information in the transform sparsity component.

The optimization problem may be of the form:

$$\hat{x} = \arg\min_x \left\{ \frac{1}{2}\|Ex - k\|_2^2 + \alpha\Psi_t(\mathcal{R}x) \right\} \quad (3)$$

In equation (3) the optimization problem incorporates the motion information in the transform sparsity component, but does not incorporate motion information in the data consistency component.

The optimization problem may be of the form:

$$\hat{x} = \arg\min_x \left\{ \frac{1}{2}\|Ex - b\|_2^2 + \alpha\Psi_t(\mathcal{R}x) \right\} \quad (4)$$

In equation (4) the optimization problem incorporates the motion information in the transform sparsity component and the data consistency component.

The optimization problem may be of the form:

$$\hat{x} = \arg\min_x \left\{ \frac{1}{2}\|Ex - b\|_2^2 + \alpha\Psi_t(x) + \beta\Psi_s(x) \right\} \quad (5)$$

The optimization problem may be of the form:

$$\hat{x} = \arg\min_x \left\{ \frac{1}{2}\|Ex - k\|_2^2 + \alpha\Psi_t(\mathcal{R}x) + \beta\Psi_s(x) \right\} \quad (6)$$

The optimization problem may be of the form:

$$\hat{x} = \arg\min_x \left\{ \frac{1}{2}\|Ex - b\|_2^2 + \alpha\Psi_t(\mathcal{R}x) + \beta\Psi_s(x) \right\} \quad (7)$$

The above optimization problems may further comprise a sparsifying transform in the backward direction. This sparsifying transform may be of the form $\Psi_{-t}(\mathcal{R}x)$ or $\Psi_{-t}(x)$.

The compressed sensing procedure may be a first reconstruction procedure, and the method may further include performing a second reconstruction procedure using the MR image data reconstructed by the first reconstruction procedure.

Performing the second reconstruction procedure includes using the MR image data reconstructed using the first reconstruction procedure to determine one or more nonrigid motion fields, and, for each of the number of bins, using the one or more nonrigid motion fields to reconstruct the MR image data from the k-space data in the respective bin. The non-rigid motion fields are estimated using a non-rigid image registration algorithm. The nonrigid motion fields may describe the motion and deformation of the heart. They may be displacement vectors defined at each voxel that find the correspondence between a bin image and the reference image, in order to align the images. These not rigid motion fields may also be used in equation (7) or other similar equations as a replacement for the operator $\mathcal{R}$. This would involve solving the optimization twice. Since this is a more accurate image registration, performed on a 3D high resolution image, the sparsity should increase. The algorithm may be based on free-form deformations that are modelled by b-splines. This produces a set of non-rigid deformations fields, relating each motion phase (e.g. respiratory phase) to a reference state (e.g. end-expiration).

Performing the second reconstruction of the MR image data may also include solving an optimization problem comprising a data consistency component.

The data consistency component may be an operator, G, that incorporates information from non-rigid motion fields estimated from the reconstructed MR image data.

The optimization procedure for the second reconstruction seeks to minimize the difference between the reconstructed MR image data, x, as transformed into k-space using the operator, G, and the acquired k-space data, k or the motion corrected k-space data, b.

The data consistency component seeks to minimize the $l_2$-norm of the difference between the reconstructed MR image data, x, as transformed into k-space using the operator, G, and the acquired k-space data, k or the motion corrected k-space data, b.

The operator G may be determined as $G = \Sigma_i E_i U_i$,
wherein E is an encoding operator for the bin i, and
wherein U is the one or more non-rigid motion fields estimated from the MR image data reconstructed using the first reconstruction procedure for the bin i.

The encoding operator may be defined as E=AFS. The encoding operator may thus incorporate the sampling matrix A for each bin i, Fourier transform F and coil sensitivities S.

The optimization problem for the second reconstruction may be of the form:

$$\hat{x} = \underset{x}{\operatorname{argmin}} \left\{ \frac{1}{2} \|Gx - k\|_2^2 \right\} \quad (8)$$

wherein G is as defined above, and where k is the binned k-space data.

The optimization problem for the second reconstruction may be of the form:

$$\hat{x} = \underset{x}{\operatorname{argmin}} \left\{ \frac{1}{2} \|Gx - b\|_2^2 \right\} \quad (9)$$

wherein G is as defined above, and where b is the motion corrected binned k-space data.

The optimization problem for the second reconstruction may further comprise a spatial total variation function of the form $\beta\Psi_s(x)$, wherein $\beta$ is a regularization parameter, and wherein $\Psi_s(x)$ is a spatial total variation function. The spatial total variation function may be a three-dimensional spatial total variation function.

The non-rigid motion fields used in the second optimization procedure may be used instead in a subsequent first optimization procedure so as to further increase the sparsity in the sparsifying transform $\Psi_t(\mathcal{R}x)$ instead of or in addition to the motion information. That is, the non-rigid motion fields can be sued to generate respiratory or other motion resolved nonrigid motion-compensated images.

The k-space data may be acquired using a non-Cartesian sampling scheme, which may be a radial sampling scheme. The k-space data may be acquired using a radial sampling scheme with golden angle separation.

The k-space data may be acquired using a Cartesian sampling scheme. The k-space data may be acquired using a golden-step Cartesian trajectory with spiral or radial profile ordering. Significantly, existing approaches such as XD-GRASP generally use a radial sampling scheme due to the increased robustness to motion provided by such radial sampling schemes. This is because, as explained previously, radial sampling schemes densely sample the central region of k-space and the center of k-space, itself, is sampled multiple times. Cartesian sampling does not sample the center of k-space repeatedly, and thus does not provide the same robustness to motion as radial sampling. However, Cartesian sampling offers benefits over radial sampling in many applications. These benefits include a higher signal-to-noise ratio efficiency, i.e. per unit of measurement time, lower sensitivity to off-resonance and gradient delays, and reduced reconstruction complexity.

The present invention is able to achieve the benefits of Cartesian sampling while mitigating/reducing the negatives of Cartesian sampling by using the motion information for the subject obtained from the plurality of navigator signals in the reconstruction of the MR image data. The use of motion information helps compensate for motion in the k-space data and thus reduce the susceptibility of the reconstruction to motion even if a Cartesian sampling scheme is used. Respiratory and/or cardiac resolved MR image data may thus be reconstructed.

The navigator signals may be generated from image navigator pulses. The image navigator pulses may be 1D, 2D, or 3D image navigator pulses.

The use of 3D image navigator pulses may be beneficial in certain applications to estimate beat-to-beat 3D translational motion, and thus, additionally allowing for motion correction in the anterior-posterior direction.

The k-space data may be for a 2D image region of the subject, or may be for a 3D image region of the subject.

The navigator signals may be 1D, 2D, or 3D navigator signals.

According to a second aspect of the invention, there is provided a MR apparatus that includes a computing system, and an MR data acquisition scanner having a basic field magnet, a gradient system, and an excitation system. The gradient system is operated to apply a magnetic field gradient. The excitation system is operated to apply an excitation pulse to the subject and to receive signals from the subject. The computing system is in communication with the excitation system, and the gradient system for controlling these components. The computing system receives the signals from the excitation system. The computing system is further configured to execute program code to control the gradient system and the excitation system to acquire k-space data of an image region of a subject, and a number of navigator signals for the image region of the subject. The computing system is further configured to sort the k-space data into a number of bins, the number of bins representing different motion states of the subject. The computing system is further configured to, for each of the number of bins, execute a compressed sensing procedure to reconstruct the MR image data from the k-space data in the respective bin. The compressed sensing procedure includes solving an optimization problem involving a data consistency component and a transform sparsity component. Motion information for the subject obtained from the number of navigator signals is incorporated by the computing system into at least one of the data consistency component and the transform sparsity component of the optimization problem.

The computing system is configured to execute program code for controlling the MR apparatus to perform the method as described above in relation to the first aspect.

According to a third aspect of the invention, there is provided a non-transitory computer readable data storage medium encoded with programming instructions, when executed by a computing device, cause the computing device to perform the method as described above in relation to the first aspect.

DESCRIPTION OF THE PREFERRED EMBODIMENTS

The present invention relates to compressed sensing procedures which comprise solving optimization problems comprising a data consistency component and a transform sparsity component.

An example of a compressed sensing procedure suitable for use with the present invention will now be described which includes the following steps (1) to (9).

In step (1) of this example of the inventive compressed sensing procedure, the original acquired k-space data is transformed into MR image data (e.g. a MR image), e.g. through use of a Fourier transform. The MR image data may suffer from sub-sampling artefacts. However, if an incoherent sampling scheme is used to acquire the k-space, these artefacts may appear to be 'smeared' over the image. That is, almost homogeneous noise-like artefacts may appear in the MR image data. The reconstructed MR image data may serve as a starting point for the optimization problem. The optimization problem seeks to find a better solution (a better set of MR image data) that is also consistent with the original acquired k-space data.

In step (2) of this example, the MR image data is transformed into a sparse representation (W-space).

The purpose of the sparse transformation is to attempt to locally separate the desired signal from the noise artefacts. The W-space is a better suited depiction of the image as the sparsity in W-space is higher than in the original image space. A higher sparsity means that the useful image content is concentrated in a few pixels in W-space, while most of the pixels have only a very low signal.

After the transformation into W-space, the useful image content is better separated from the noise artefacts.

In step (3), the W-space is thresholded to remove noise.

One example thresholding procedure which may be used is referred to as 'soft thresholding' in which all pixels with a value less than the threshold are set to zero, and then the threshold is subtracted from all other pixels. As a result of the thresholding procedure, many pixels in the W-space have a value of 0, and as such there are fewer non-zero pixels. Consequently, the sparsity of the image in W-space is increased.

In step (4), the W-space is transformed back into the MR image data.

The W-space representation may be transformed back into the image space using an inverse W transformation. The transformed MR image data has less noise due to the thresholding procedure described above, but does not exactly reflect the original acquired k-space data. As a result, the compressed sensing procedure may then check the image consistency. That is, how well the denoised MR image data still represents the acquired k-space data.

In step (5), the MR image data of step (4) is transformed into k-space. An inverse Fourier transform may be applied to transform the MR image data of step (4) back into k-space. It will be appreciated that the k-space data will cover all spatial frequencies while the original sub-sampled acquired k-space data covers only a portion of the frequencies.

In step (6) the k-space data of step (5) is filtered. The k-space data of step (5) may be filtered such that the filtered k-space data only depicts the spatial frequencies that were acquired during the original k-space acquisition. The filtering may comprise setting all of the k-space data of step (5) to zero except for the points of k-space data that correspond to the spatial frequencies acquired during the original k-space data acquisition.

In step (7) the k-space data of step (6) is subtracted from the original k-space data. The difference between the k-space data of step (6) and the original k-space data may correspond to the error that the thresholding of step (3) has created compared to the original acquired k-space.

In step (8), the 'difference' k-space data of step (7) is transformed into the MR image space so as to form a 'difference' MR image. The k-space data may be transformed using a Fourier transformation.

In step (9), the MR image data of step (1) is updated with the 'difference' MR image of step (9).

The updating may comprise adding the 'difference' MR image of step (9) to the MR image data of step (1). The updated MR image data may have less noise-like artefacts (corresponding to a higher sparsity in W-space) than the image had before the update. At the same time, the updated MR image data has been made consistent with the measured k-space.

Steps (3)-(9) may be repeated, e.g. as part of an iterative optimization procedure. Each iteration may increase the sparsity (in W-space), which corresponds to diminishing the aliasing artefacts in image space. At the same time, the consistency of the reconstruction with measured k-space is taken care of.

The following examples may use the compressed sensing procedure of the form as described generally above. It will further be appreciated that the present invention is not directed towards a particular compressed sensing procedure, but rather the beneficial incorporation of motion information for the subject obtained from the plurality of navigator signals into at least one of the data consistency component and the transform sparsity component of the optimization problem of the compressed sensing procedure.

Figure 1:
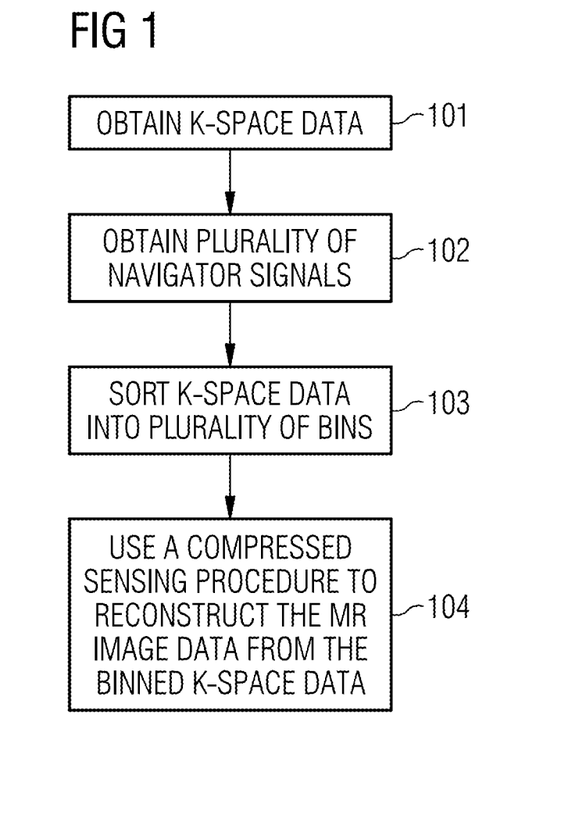
FIG. 1 is a flowchart for an embodiment of the method according to the first aspect of the present invention.

Referring to FIG. 1, there is shown a method of reconstructing MR image data from k-space data.

Step 101 concerns obtaining k-space data of an image region of a subject.

In the example of FIG. 1, the k-space data are three-dimensional (3D) whole-heart coronary MR angiography data (CMRA) acquired using a Cartesian trajectory. The Cartesian trajectory samples the ky-kz plane using a golden-step Cartesian trajectory with spiral profile ordering. The MR image sequence for generating the 3D CMRA data in this example implementation is a 3D balanced steady-state free precession (bSSFP) sequence, which may be ECG-triggered.

The present invention is not limited to the particular k-space acquisition procedure of the example of FIG. 1. In particular, the present invention is not limited to 3D whole heart CMRA. Imaging other regions of the subject, such as the liver is within the scope of the present invention. Further, obtaining 2D image regions rather than 3D image regions is within the scope of the present invention. Further, the present invention is not limited to Cartesian sampling, other forms of sampling such as radial sampling and radial sampling with golden angle separation are within the scope of the present invention. Further, the present invention is not limited to bSSFP sequences. Other MR image sequences such as gradient echo sequences are within the scope of the present invention.

Step 102 concerns obtaining a number of navigator signals for the image region of the subject.

In the example of FIG. 1, the number of navigator signals for the image region of the subject are acquired using low-resolution 2D image navigator pulses. The low-resolution 2D image navigator pulses may be spatially encoded into the ramp-up pulses of the bSSFP sequence, and may be generated such that a navigator signal is acquired in each heartbeat of the subject during the imaging sequence. The navigator signals may be acquired before each spiral interleaf of the whole-heart 3D CMRA acquisition.

The present invention is not limited to the particular navigator signal acquisition procedure of the example of FIG. 1. Other forms of navigator signal are within the scope of the present invention. For example, the navigator signals may be acquired using 1D or 3D image navigators.

Step 103 concerns sorting the k-space data into a number of bins, the number of bins representing different motion states of the subject.

In the example of FIG. 1, sorting the k-space data into a number of bins comprises registering the obtained 2D image navigator signals to a common respiratory position (end-expiration) to estimate 2D beat-to-beat translational (left-right: LR and superior-inferior: SI) motion. The estimated SI motion is then used to group the 3D CMRA data into bins representing different motion states (e.g. respiratory phases) of the subject.

The present invention is not limited to the sorting procedure of FIG. 1. Other ways of sorting the k-space data into the number of bins are within the scope of the present invention. The particular sorting procedure used may vary depending on the image region of the subject, the motion information and whether 1D, 2D, or 3D navigator signals are used.

Step 104 includes, for each of the number of bins, executing a compressed sensing procedure to reconstruct the MR image data from the k-space data in the respective bin, the compressed sensing procedure comprises solving an optimization problem comprising a data consistency component and a transform sparsity component, wherein motion information for the subject obtained from the number of navigator signals is incorporated into at least one of the data consistency component and the transform sparsity component of the optimization problem.

In the example of FIG. 1, the motion information for the subject obtained from the plurality of navigator signals is incorporated into the data consistency component of the optimization problem.

In particular, step 104 includes correcting for motion within the plurality of bins using the motion information for the subject obtained from the number of navigator signals so as to generate motion corrected binned k-space data. The correcting for motion within the number of bins involves correcting for translational motion within the number of bins. In this example, the translational motion is 2D translational motion, and in particular is beat-to-beat translation information. Or, in other words, the translational motion of the subject between heartbeats. The beat-to-beat translation information is 2D beat-to-beat translation information, e.g. obtained from 2D image navigator signals. This means, in this example, that 2D translational motion correction within each bin is performed in k-space before the reconstruction to improve image quality of each bin.

In other words, in the example of FIG. 1 the acquired CMRA data is distributed into multiple respiratory bins and 2D beat-to-beat translational motion is estimated from 2D image navigators. This 2D beat-to-beat translation motion is used to correct for intra-bin 2D translational motion in k-space, thereby improving the image quality of each bin.

The present invention is not limited to the correcting procedure of FIG. 1. Other ways for correcting for motion within the plurality of bins are within the scope of the present invention. Further, the present invention does not require that the motion within the plurality of bins is corrected for in all embodiments.

In the example of FIG. 1, the compressed sensing procedure then uses the motion corrected binned k-space data in the data consistency component of the optimization problem.

In particular, the data consistency component of the optimization problem comprises the function $\frac{1}{2}\|Ex-b\|_2^2$,
  wherein x is the reconstructed MR image data,
  wherein b is the motion corrected binned k-space data,
  wherein E is an encoding operator, and
  wherein $\|\ \|_2^2$ denotes the $l_2$-norm defined as $|x|_2^2 = \sqrt{(\Sigma_i |x_i|^2)}$.

In one example implementation, the optimization problem may be of the form:

$$\hat{x} = \underset{x}{\mathrm{argmin}}\left\{\frac{1}{2}\|Ex-b\|_2^2 + \alpha \Psi_t(x)\right\} \quad (2)$$

$\Psi_t(x)$ is a sparsifying transform and $\alpha$ is a regularisation parameter.

In another example implementation, the optimization problem may further incorporate the motion information for the subject obtained from the plurality of navigator signals in the transform sparsity component of the optimization problem. In this example, the transform sparsity component comprises a temporal total variation function. The motion information for the subject obtained from the plurality of navigator signals is then incorporated into the temporal total variation function. This means that the images are aligned to one motion state (e.g. respiratory position) to increase sparsity in the motion (e.g. respiratory) domain.

In this example, the sparsifying transform is the function $\Psi_t(\mathcal{R}x)$ where $\mathcal{R}x$ is the motion-corrected domain.

$\mathcal{R}x$ is a motion-corrected domain and may be determined such that $\mathcal{R}x = T_b x_b$, wherein $T_b$ is a translation transform that maps a bin image $x_b$ to a reference image $x_r$ determined using the motion information. The reference image may be an end-expiration image.

In this particular example implementation, the sparsifying transform $\Psi_t(\mathcal{R}x)$, is defined as:

$$\Psi_t(\mathcal{R}x) = \|\nabla_t(\mathcal{R}x)\|_1 = \left\| \begin{bmatrix} I & -I & 0 & \cdots & 0 \\ 0 & I & -I & \cdots & 0 \\ \vdots & & \ddots & & \vdots \\ 0 & \cdots & 0 & I & -I \end{bmatrix} \begin{bmatrix} \mathcal{T}_1 x_1 \\ \mathcal{T}_2 x_2 \\ \vdots \\ \mathcal{T}_N x_N \end{bmatrix} \right\|_1$$

In this example, $\nabla_t$ is a finite differences operator along the temporal motion (e.g. respiratory) dimension, I is the identity matrix and $\mathcal{T}_b$ is the translation transform that maps the bin image $x_b$ to the reference image $x_1$ (end-expiration).

In this example, $\mathcal{T}_1 = I$.

$\|u\|_1$ is the $l_1$-norm and is defined as $\|u\|_1 = \Sigma_{i=1}^n |u(i)|$, where i is the ith element of u and n is the total number of elements.

In this example implementation, the optimization problem may be of the form:

$$\hat{x} = \underset{x}{\mathrm{argmin}}\left\{\frac{1}{2}\|Ex-b\|_2^2 + \alpha \Psi_t(\mathcal{R}x)\right\} \quad (4)$$

In another example implementation, the optimization problem further comprises a spatial total variation function of the form $\beta \Psi_s(x)$, wherein $\beta$ is a regularization parameter, and wherein $\Psi_s(x)$ is a spatial total variation function. The spatial total variation function may be a three-dimensional total variation function.

In this example implementation, the optimization problem may be of the form:

$$\hat{x} = \underset{x}{\mathrm{argmin}}\left\{\frac{1}{2}\|Ex-b\|_2^2 + \alpha \Psi_t(\mathcal{R}x) + \beta \Psi_s(x)\right\} \quad (7)$$

In this or another example implementation, the optimization problem may only incorporate the motion information in the data consistency component of the optimization problem. The optimization problem may be of the form:

$$\hat{x} = \arg\min_x \left\{ \frac{1}{2} \|Ex - b\|_2^2 + \alpha \Psi_t(x) + \beta \Psi_s(x) \right\} \quad (5)$$

As discussed above, the present invention does not require that the motion within the number of bins is corrected for in all embodiments. In other embodiments, the motion information for the subject obtained from the number of navigator signals may only be incorporated in the transform sparsity component of the optimization problem.

In one example implementation, the optimization problem may be of the form:

$$\hat{x} = \arg\min_x \left\{ \frac{1}{2} \|Ex - k\|_2^2 + \alpha \Psi_t(\mathcal{R}x) \right\} \quad (3)$$

Here, k is the binned k-space data, i.e. k-space that is not motion corrected.

In another example implementation, the optimization problem may be of the form:

$$\hat{x} = \arg\min_x \left\{ \frac{1}{2} \|Ex - k\|_2^2 + \alpha \Psi_t(\mathcal{R}x) + \beta \Psi_s(x) \right\} \quad (6)$$

The above optimization problems may further comprise a sparsifying transform in the backward direction. This sparsifying transform may be of the form $\Psi_{-t}(\mathcal{R}x)$ or $\Psi_{-t}(x)$.

By additionally using a sparsifying transform in the backward direction, the sparsity is able to be calculated between two or more adjacent respiratory phases because the respiratory motion is approximately periodic. This approach may provide a sparser representation in the motion-corrected respiratory domain, particularly because this approach depends less on the quality of the end-expiration image and the accuracy of the motion model used in the reconstruction.

The optimization problems mentioned above can all be solved using nonlinear conjugate gradient methods. Other methods for solving compressed sensing optimization problems are within the scope of the present invention.

The reconstruction methods described above have been found to produce high-quality respiratory-resolved images for all respiratory phases, allowing clear visualization of coronary arteries in CMRA. The reconstruction method helps to reduce respiratory motion, and thus, improves the visualized vessel length and sharpness of both coronaries compared to the existing Cartesian XD-GRASP approach.

Incorporating the motion information into the data consistency component of the optimization problem, e.g. by performing intra-bin translation motion correction, has been found to improve the quality of the respiratory resolved images. Additionally or separately, incorporating the motion information into the transform sparsity component of the optimization problem has been found to increase the sparsity in the respiratory dimension, and hence improve the quality of the image reconstruction. Further, incorporating the spatial total variation function into the transform sparsity component has been found to produce a denoising effect in the resulting image reconstruction, and thus also improves the quality of the image reconstruction. In addition, the spatial total variation function may also help handling undersampled data.

In example implementations, the optimization problems described above are a first stage of the compressing sensing reconstruction procedure.

In these example implementations, the method further comprises performing a second reconstruction procedure using the MR image data reconstructed using the first reconstruction procedure In an example implementation, the second reconstruction procedure comprises using the MR image data reconstructed using the first reconstruction procedure to determine one or more nonrigid motion fields. For each of the plurality of bins, the one or more nonrigid motion fields may be used to reconstruct the MR image data from the k-space data in the respective bin.

In particular examples, performing the second reconstruction of the MR image data comprises solving an optimization problem comprising a data consistency component. The data consistency component may comprise an operator $G = \sum_b E_b U_b$, wherein E is an encoding operator for the bin b, and wherein U is the one or more non-rigid motion fields estimated from the MR image data reconstructed using the first reconstruction procedure for the bin b.

In these examples, the encoding operator is defined as E=AFS. The encoding operator thus incorporates the sampling matrix A for each bin b, Fourier transform F and coil sensitivities S.

In one example implementation, the optimization problem for the second reconstruction is of the form:

$$\hat{x} = \arg\min_x \left\{ \frac{1}{2} \|Gx - k\|_2^2 \right\} \quad (8)$$

wherein G is as defined above, and where k is the binned k-space data.

In another example implementation, the optimization problem for the second reconstruction is of the form:

$$\hat{x} = \arg\min_x \left\{ \frac{1}{2} \|Gx - b\|_2^2 \right\} \quad (9)$$

wherein G is as defined above, and where b is the motion corrected binned k-space data.

In the above examples, the number of the plurality of bins may be predetermined or selected by an operator, e.g. so as to provide an acceptable compromise between remaining intra-bin motion and under sampling artefacts. In addition, the number of the plurality of bins may be selected according to the regularity or irregularity of the subject's breathing pattern. For example, when the respiratory motion is relatively large, more respiratory phases could be added until all the bin widths are smaller than a certain value (e.g. 3 mm).

In some examples, the method may further comprise applying an autofocus technique to at least one or all of the bins. This may be applied to the bins to estimate, iteratively, the 3D translation parameters that maximize the sharpness of an image region of the subject (e.g. the coronary arteries). This approach may use estimated SI and LR motion as prior information, and further improve the bin images.

Figure 2:
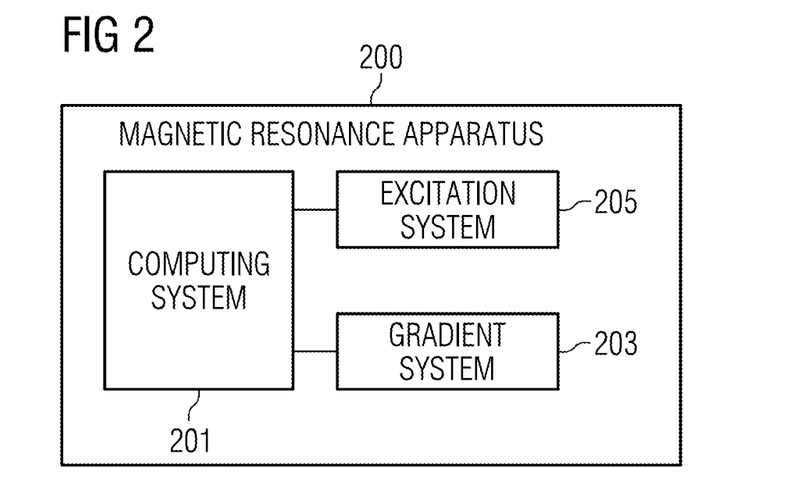
FIG. 2 is a block diagram of an MR apparatus according to the second aspect of the present disclosure.

In some examples, intra-bin residual translation motion may be addressed by acquiring 3D image navigator signals. 3D image navigator signals may be used to estimate beat-to-beat 3D translation motion, and thus additionally allow for motion correction in the anterior-posterior direction. Subsequently, these bin images could be used to estimate 3D translational or nonrigid inter-bin motion parameters at each iteration of the optimization procedure. These approaches may help further increase the sparsity in the motion (e.g. respiratory) dimension, and hence improve the quality of the respiratory-resolved reconstructions. In other approaches, the reconstructed MR data from the first reconstruction procedure may be used to estimate 3D bin-to-bin nonrigid motion, which can be used to provide a single-phase 3D nonrigid motion-compensated image. As mentioned above, the nonrigid motion fields may also be used in the first optimization problem instead of the translational motion. For example, in equation (7) $\mathcal{R}$ may be set as the 2D translational motion or the 3D nonrigid motion FIG. 2 shows an example of an MR apparatus 200 according the second aspect of the disclosure. The MR apparatus 200 comprises a computing system 201, and an MR data acquisition scanner that has a basic field magnet, a gradient system 203, and an excitation system 205.

The gradient system 203 is operated to apply a magnetic field gradient. The gradient system 203 is operated to apply magnetic field gradients along three spatial axes.

The excitation system 205 may include a transmitter (not shown) and a receiver (not shown). The excitation system 205 can be an RF system with one or more RF coils (not shown). The excitation system 205 is designed to apply an excitation pulse to the subject and to receive signals from the subject.

As noted, the scanner of the MR apparatus 200 includes a magnet (not shown) for establishing a stationary magnetic field. The magnet can include a permanent magnet, a superconducting magnet or other type of magnet.

The computing system 201 is in communication with the excitation system 205, and the gradient system 203 for controlling these components. The computing system 201 is configured to receive the signals from the excitation system 205.

The computing system 201 is further configured to execute program code to control the gradient system 203 and the excitation system 205 to acquire k-space data of an image region of a subject, and a number of navigator signals for the image region of the subject.

The computing system 201 is further configured to sort the k-space data into a number of bins, the number of bins representing different motion states of the subject.

The computing system 201 is further configured to, for each of the number of bins, execute a compressed sensing procedure (algorithm) to reconstruct the MR image data from the k-space data in the respective bin. The compressed sensing procedure involves solving an optimization problem comprising a data consistency component and a transform sparsity component. Motion information obtained from the number of navigator signals is incorporated into at least one of the data consistency component and the transform sparsity component of the optimization problem.

The computing system 201 is configured to execute program code for controlling the MR apparatus 200 to perform the method of the first aspect. The computing system 201 could be an integrated component of the MR apparatus 200. The computing system 201 could be a unit of a desktop computer, a workstation, a server, or a laptop computer.

According to aspects of the invention, there is also provided a computer-readable medium having instructions recorded thereon which, when executed by a processing unit, cause the processing unit to perform the method of the first or second aspect.

In other words, there is provided a method for operating an MR apparatus in order to reconstruct magnetic resonance (MR) image data from k-space data. The method includes obtaining k-space data of an image region of a subject (101). The method includes obtaining a number of navigator signals for the image region of the subject (102). The method includes sorting the k-space data into a number of bins, the plurality of bins representing different motion states of the subject (103). The method includes, for each of the number of bins, executing a compressed sensing procedure to reconstruct the MR image data from the k-space data in the respective bin (104). The compressed sensing procedure involves solving an optimization problem having a data consistency component and a transform sparsity component. Motion information obtained from the plurality of navigator signals is incorporated into at least one of the data consistency component and the transform sparsity component of the optimization problem.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for reconstructing magnetic resonance (MR) image data from k-space data, the method comprising:
providing a computer with k-space data of an image region of a subject;
also providing the computer with a plurality of navigator signals for the image region of the subject;
in said computer, sorting the k-space data into a plurality of bins (103), the plurality of bins representing different motion states of the subject;
for each of the plurality of bins, executing a compressed sensing procedure in said computer to reconstruct the MR image data from the k-space data in the respective bin, execution of the compressed sensing procedure comprises solving an optimization problem comprising a data consistency component and a transform sparsity component; and
in said computer, incorporating motion information for the subject obtained from the plurality of navigator signals into the transform sparsity component of the optimization problem.

2. The method as claimed in claim 1, further comprising, in said computer, correcting for motion within the plurality of bins using the motion information for the subject obtained from the plurality of navigator signals so as to generate motion corrected binned k-space data, wherein the data consistency component uses the motion corrected binned k-space data.

3. The method as claimed in claim 2, wherein the data consistency component of the optimization problem comprises a determination of the difference between the reconstructed MR image data transformed into k-space and the motion corrected binned k-space data.

4. The method as claimed in claim 3, wherein the determination of the difference comprises determining the l2-norm of the result of the subtraction of the motion corrected binned k-space data from the reconstructed MR image data transformed into k-space.

5. The method as claimed in claim 1, wherein the transform sparsity component of the optimization problem transforms the reconstructed MR image data to a motion-corrected domain using the motion information for the subject obtained from the plurality of navigator signals so as to generate motion-corrected reconstructed MR image data, and applies a sparsifying transform to the motion-corrected reconstructed MR image data.

6. The method as claimed in claim 5, wherein the sparsifying transform comprises performing a finite differences operation on the motion-corrected reconstructed MR image data.

7. The method as claimed in claim 6, wherein the transform sparsity component comprises determining the l1-norm of the result of the finite differences operation performed on the motion-corrected reconstructed MR image data.

8. The method as claimed in claim 1, wherein the optimization problem further comprises a spatial total variation function.

9. The method as claimed in claim 1, wherein both the data consistency component and the transform sparsity component of the optimization problem incorporate the motion information for the subject obtained from the plurality of navigator signals.

10. The method as claimed in claim 1, wherein the optimization problem is of the form $$\hat{x} = \operatorname*{argmin}_{x} f(x),$$

wherein f(x) is a function defined as {data consistency component+α(transform sparsity component)}, wherein α is a regularization parameter.

11. The method as claimed in claim 1, wherein sorting the k-space data into the plurality of bins comprises sorting the k-space data into the plurality of bins using the motion information for the subject obtained from the plurality of navigator signals.

12. The method as claimed in claim 1, wherein the compressed sensing procedure is a first reconstruction procedure, and wherein the method further comprises performing a second reconstruction procedure using the MR image data reconstructed using the first reconstruction procedure.

13. The method as claimed in claim 12, wherein performing the second reconstruction procedure comprises using the MR image data reconstructed using the first reconstruction procedure to determine one or more nonrigid motion fields, and further comprises, for each of the plurality of bins, using the one or more nonrigid motion fields to reconstruct the MR image data from the k-space data in the respective bin.

14. A method for operating a magnetic resonance (MR) image apparatus comprising an MR data acquisition scanner, said method comprising:
operating the MR data acquisition scanner to acquire k-space data from an image region of a subject in the MR data acquisition scanner, and to obtain a plurality of navigator signals from said image region;
providing the k-space data and the plurality of navigator signals to a computer and, in said computer, sorting the k-space data into a plurality of bins (103), the plurality of bins representing different motion states of the subject;
for each of the plurality of bins, executing a compressed sensing procedure in said computer to reconstruct the MR image data from the k-space data in the respective bin, execution of the compressed sensing procedure comprises solving an optimization problem comprising a data consistency component and a transform sparsity component; and
in said computer, incorporating motion information for the subject obtained from the plurality of navigator signals into the transform sparsity component of the optimization problem.

15. A magnetic resonance (MR) apparatus comprising:
an MR data acquisition scanner comprising a gradient system, and an excitation system;
a computing system in communication with the excitation system, and the gradient system, and configured to receive the signals from the excitation system;
the computing being configured to execute program code in order to control the gradient system so as to apply a magnetic field gradient in said scanner and in order to control the excitation system so as to apply an excitation pulse to a subject in the scanner and to receive signals from the subject resulting from the excitation that represent k-space data of an image region of a subject, and to acquire a plurality of navigator signals for the image region of the subject;

the computing system being configured to sort the k-space data into a plurality of bins, the plurality of bins representing different motion states of the subject;

the computing system being configured to, for each of the plurality of bins, execute a compressed sensing procedure to reconstruct the MR image data from the k-space data in the respective bin, execution of the compressed sensing procedure comprising solving an optimization problem comprising a data consistency component and a transform sparsity component, and the computing system is configured to incorporate motion information for the subject obtained from the plurality of navigator signals into the transform sparsity component of the optimization problem.

16. A non-transitory, computer-readable data storage medium encoded with programming instructions, said storage medium being loaded into a computer and said programming instructions causing said computer to:

receive k-space data obtained from an image region of a subject situated in an MR data acquisition scanner;

also receive a plurality of navigator signals of the image region of the subject;

sort the k-space data into a plurality of bins, the plurality of bins representing different motion states of the subject;

for each of said plurality of bins, execute a compressed sensing procedure to reconstruct MR image data from the k-space data in the respective bin, the execution of the compressed sensing procedure comprising solving an optimization problem comprising a data consistency component and a transform sparsely component; and incorporate motion information for the subject obtained from the plurality of navigator signals into the transform sparsity component of the optimization problem.

* * * * *